(12) United States Patent
Anma et al.

(10) Patent No.: US 6,319,812 B1
(45) Date of Patent: Nov. 20, 2001

(54) METHOD OF MANUFACTURING A SEMICONDUCTOR DEVICE

(75) Inventors: Masatoshi Anma; Yoshinori Tanaka; Yoshifumi Takata, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/577,136

(22) Filed: May 24, 2000

(30) Foreign Application Priority Data

Nov. 10, 1999 (JP) .................................... 11-320014

(51) Int. Cl.$^7$ ..................................... H01L 29/78
(52) U.S. Cl. .................. 438/618; 438/197; 438/584; 438/585; 438/587; 438/588; 438/660; 438/675
(58) Field of Search ..................................... 438/197, 584, 438/585, 587, 588, 618, 660, 675

(56) References Cited

FOREIGN PATENT DOCUMENTS 62-196870 * 8/1987 (JP) .............................. H01L/29/78
4-282860 10/1992 (JP) .

* cited by examiner

Primary Examiner—Charles Bowers
Assistant Examiner—Lisa Kilday
(74) Attorney, Agent, or Firm—McDermott, Will & Emery

(57) ABSTRACT

Sintering is effected a gate insulating film of a transistor in a hydrogen atmosphere at a temperature from 450° C. to 600° C. only before formation of an interconnection layer such as an aluminum interconnection layer which is less resistant to heat treatment at a temperature of 450° C. or more. Thereby, a method of manufacturing a semiconductor device can bring about sufficient recovery of a gate insulating film from process damages and others while preventing an adverse effect on the interconnection layer less resistant to the heat treatment at a high temperature.

7 Claims, 17 Drawing Sheets

METHOD OF MANUFACTURING A SEMICONDUCTOR DEVICE

BACKGROUND OF THE INVENTION

1. Field of the Invention

The present invention relates to a semiconductor device manufacturing method having a step of thermally processing a gate insulating film of a transistor.

2. Description of the Background Art

A conventional manufacturing method employs a technique of effecting heat treatment on a gate insulating film of a transistor, which is formed on a semiconductor substrate, within a hydrogen atmosphere for the purpose of recovery from process damages applied to the gate insulating film forming the transistor and for the purpose of reducing a thermal stress occurring on respective interfaces between the gate insulating film and the gate electrode and between the gate insulating film and the semiconductor substrate. This technique will be referred to as "sintering" hereinafter. A semiconductor device manufacturing method using conventional sintering will now be described with reference to FIGS. 15 to 17.

According to the semiconductor device manufacturing method using the conventional sintering, an element isolating and insulating film 111 is formed on a semiconductor substrate 110 so that element isolating regions are formed. Then, a gate insulating film 113 and a gate electrode 114 are formed on semiconductor substrate 110 in the element formation region. Subsequently, source/drain regions 112 located on the opposite sides of gate insulating film 113 and gate electrode 114 are formed at semiconductor substrate 110. Through these steps, a transistor of a field-effect type is formed.

Then, a protective insulating film 115 covering gate insulating film 113 and gate electrode 114 is formed. Thereafter, processing is performed to form an interlayer insulating film 116 covering protective insulating film 115, source/drain regions 112 and element isolating and insulating film 111. Then, contact holes reaching source/drain regions 112 are formed in interlayer insulating film 116. Thereafter, contact plugs 117 and 118 filling the contact holes are formed.

Then, tungsten interconnections 101 and 120 are formed on contact plugs 117 and 118 as well as interlayer insulating film 116. Contact plug 117 and tungsten interconnection 101 have resistance values which rise if they are thermally processed for a long time (several minutes) at a temperature exceeding 750° C. Thereafter, a CVD (Chemical Vapor Deposition) method or a sputtering method is performed to form an interlayer insulating film 102 which covers tungsten interconnection 101 and is made of a silicon oxide film or a silicon nitride film.

Then, a contact hole 102a reaching tungsten interconnection 101 is formed in interlayer insulating film 102 by a lithography technique and a dry etching technique. Then, barrier metal film made of titanium nitride is formed over the surface of contact hole 102a and the upper surface of interlayer insulating film 102 by the CVD method or sputtering method.

Then, the CVD method is performed so that the concavities formed by the barrier metal film is filled, and a tungsten film is formed on the barrier metal film located over the upper surface of interlayer insulating film 102. The tungsten film is then subjected to CMP (Chemical Mechanical Polishing), dry etching or wet etching to form a tungsten plug 105 remaining only in the concavity formed by the barrier metal film.

Then, the CVD method or sputtering method is performed to form an aluminum film covering tungsten plug 105 and the barrier metal film. Then, dry etching is effected on the aluminum film and the barrier metal film after performing a lithography step so that an aluminum film 107 and a barrier metal film 106 are formed. Through the steps described above, the structure shown in FIG. 15 is completed. If necessary, sintering within a hydrogen atmosphere in a temperature range from 370° C. to 430° C. is effected on gate insulating film 113 in the state shown in FIG. 15 for recovering gate insulating film 113 from process damages and others so that a hillock of aluminum and a crack in the interlayer insulating film may not occur.

Thereafter, an interlayer insulating film 108 covering aluminum film 107 and barrier metal film 106 is formed. Then, the CVD method or sputtering method is performed to form an aluminum interconnection layer 109 on interlayer insulating film 108. Through the steps described above, the structure shown in FIG. 16 is completed. If necessary in the state shown in FIG. 16, sintering within a hydrogen atmosphere in a temperature range from 370° C. to 430° C. is likewise effected on gate insulating film 113 for recovering gate insulating film 113 from process damages so that a hillock of aluminum and a crack in the interlayer insulating film may not occur. Through the manufacturing process described above, the semiconductor device having the structure shown in FIG. 16 is completed.

Through the manufacturing process described above, the sintering within the hydrogen atmosphere is performed on the structure shown in FIG. 16. However, the temperature is low so that gate insulating film 113 cannot sufficiently recover from the process damages and others. For sufficiently recovering gate insulating film 113 from the process damages, the sintering temperature may be increased. However, such a high temperature may cause peeling (200) of barrier metal film 106, occurrence of a hillock 300 of aluminum interconnection 107 and a crack 400 in interlayer insulating film 108. This lowers the reliability of the semiconductor device. Accordingly, it is necessary to avoid peeling (200) of barrier metal film 106 as well as occurrence of hillock 300 of aluminum interconnection 107 and crack 400 in interlayer insulating film 108. For this reason, it is impossible to execute sintering within in an atmosphere at a high temperature, e.g., from 450° C. to 600° C., which will be referred to as a "high-temperature sintering" hereinafter, although this high-temperature sintering can sufficiently recover gate insulating film 113 from process damages and others. Consequently, it is impossible to manufacture the semiconductor device, in which gate insulating film 113 can sufficiently recover from process damages and others.

SUMMARY OF THE INVENTION

An object of the invention is to provide a method of manufacturing a semiconductor device, which can sufficiently recover a gate insulating film from process damages and others without adversely affecting other structures.

The invention provides a method of manufacturing a semiconductor device, including the steps of forming a field-effect transistor on a semiconductor substrate, forming a first conductive interconnection causing a crystal defect if thermally processed at a temperature higher than 450° C. after formation of the transistor, wherein the method includes the step of effecting high-temperature sintering on a gate insulating film of the transistor within a hydrogen atmosphere at a temperature from 450° C. to 600° C. only after the step of forming the transistor and before the step of forming the first conductive interconnection.

According to the above manufacturing method, the sintering is performed during the manufacturing process for recovering the gate insulating film of the transistor from process damages and others. This sintering is high-temperature sintering performed in a range from 450° C. to 600° C. The process damages described above are process damages based on an interface level caused by crystal defects such as dangling bonds which occur on an interface between the gate insulating film of the field-effect transistor and the semiconductor substrate as well as on an interface between the gate insulating film and the gate electrode.

According to the above manufacturing method, since the high-temperature sintering is effected on the gate insulating film of the transistor, the gate insulating film can sufficiently recover from process damages and others. The high-temperature sintering is performed only before formation of the first conductive interconnection, in which the crystal defect would occur if thermally processed at a temperature of 450° C. or more. Therefore, a hillock due to the high-temperature sintering does no occur in the first conductive interconnection. As a result, disadvantages such as occurrence of the crystal defect in the first conductive interconnection do not occur, and it is possible to manufacture the semiconductor device in which the gate insulating film of the transistor can sufficiently recover from the process damages and others.

The method of manufacturing the semiconductor device according to the invention may further include the step of forming a second conductive interconnection on the semiconductor substrate before the step of effecting the high-temperature sintering on the gate insulating film, a value of a contact resistance between the second conductive interconnection and an impurity diffusion layer rising when the second conductive interconnection is thermally processed at a temperature exceeding 750° C.

According to the above manufacturing method, the high-temperature sintering is performed at a temperature from 450° C. to 600° C. The contact resistance value between the second conductive interconnection and the impurity diffusion layer rises when the temperature of the second conductive interconnection exceeds 750° C. Therefore, an adverse effect exerted on the second conductive interconnection by the high-temperature sintering is small even when the high-temperature sintering is performed after formation of the second conductive interconnection. As a result, the second conductive interconnection having a good conductivity can be formed although the high-temperature sintering is performed.

The method of manufacturing the semiconductor device according to the invention may include the steps of forming a first interlayer insulating film covering the second conductive interconnection after formation of the second conductive interconnection and before formation of the first conductive interconnection, forming a contact hole reaching the second conductive interconnection in the first interlayer insulating film, and forming a barrier metal film extending at least along the surface of the contact hole, the first conductive interconnection filling a concavity formed by the barrier metal film and extending on the first interlayer insulating film.

According to the above manufacturing method, since the barrier metal film is formed between the first and second conductive interconnections, disadvantages such as mutual diffusion between the first and second conductive interconnections are suppressed.

The method of manufacturing the semiconductor device according to the invention may further include, after the step of effecting the high-temperature sintering on the gate insulating film and before the step of forming the first conductive interconnection, the step of cooling the second conductive interconnection and the barrier metal film in a non-oxidizing atmosphere to 200° C. or lower.

Since the manufacturing method described above has the step of cooling the semiconductor wafer in the non-oxidizing atmosphere until the second conductive interconnection and the barrier metal layer reach the temperature of 200° C. or less, oxidization of the barrier metal film can be suppressed. Therefore, the first conductive interconnection can be uniformly formed on the surface of the barrier metal. Consequently, the semiconductor device in which the first conductive interconnection has an improved conductivity can be manufactured.

The method of manufacturing the semiconductor device according to the invention may further include, before the step of forming the first interlayer insulating film and after the step of forming the barrier metal film, the step of thermally processing the first interlayer insulating film at a temperature from 350° C. to 750° C.

According to the manufacturing method described above, the first interlayer insulating film is thermally processed at the temperature from 350° C. to 750° C., moisture contained in the first interlayer insulating film is removed. Therefore, such a disadvantage can be suppressed that the barrier metal film formed on the surface of the first interlayer insulating film is peeled off from the surface of the first interlayer insulating film. Consequently, the semiconductor device having improved reliability can be manufactured.

In the method of manufacturing the semiconductor device according to the invention, the barrier metal film may be formed only on the surface of the contact hole in the step of forming the barrier metal film.

According to the above manufacturing method, the barrier metal film is not formed on the upper surface of the first interlayer insulating film, i.e., the portion on which the peeling is likely to occur. Therefore, disadvantages such as peeling of the barrier metal film from the first interlayer insulating film does not occur on the upper surface of the first interlayer insulating film. Consequently, the semiconductor device having improved reliability can be manufactured.

The method of manufacturing the semiconductor device according to the invention may further include the step of forming a second interlayer insulating film covering the first conductive interconnection.

According to the manufacturing method described above, the high-temperature sintering is performed before formation of the first interlayer insulating film. Consequently, it is possible to prevent occurrence of a crack in the first interlayer insulating film, which may occur in the case where the high-temperature sintering is performed after formation of the first interlayer insulating film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
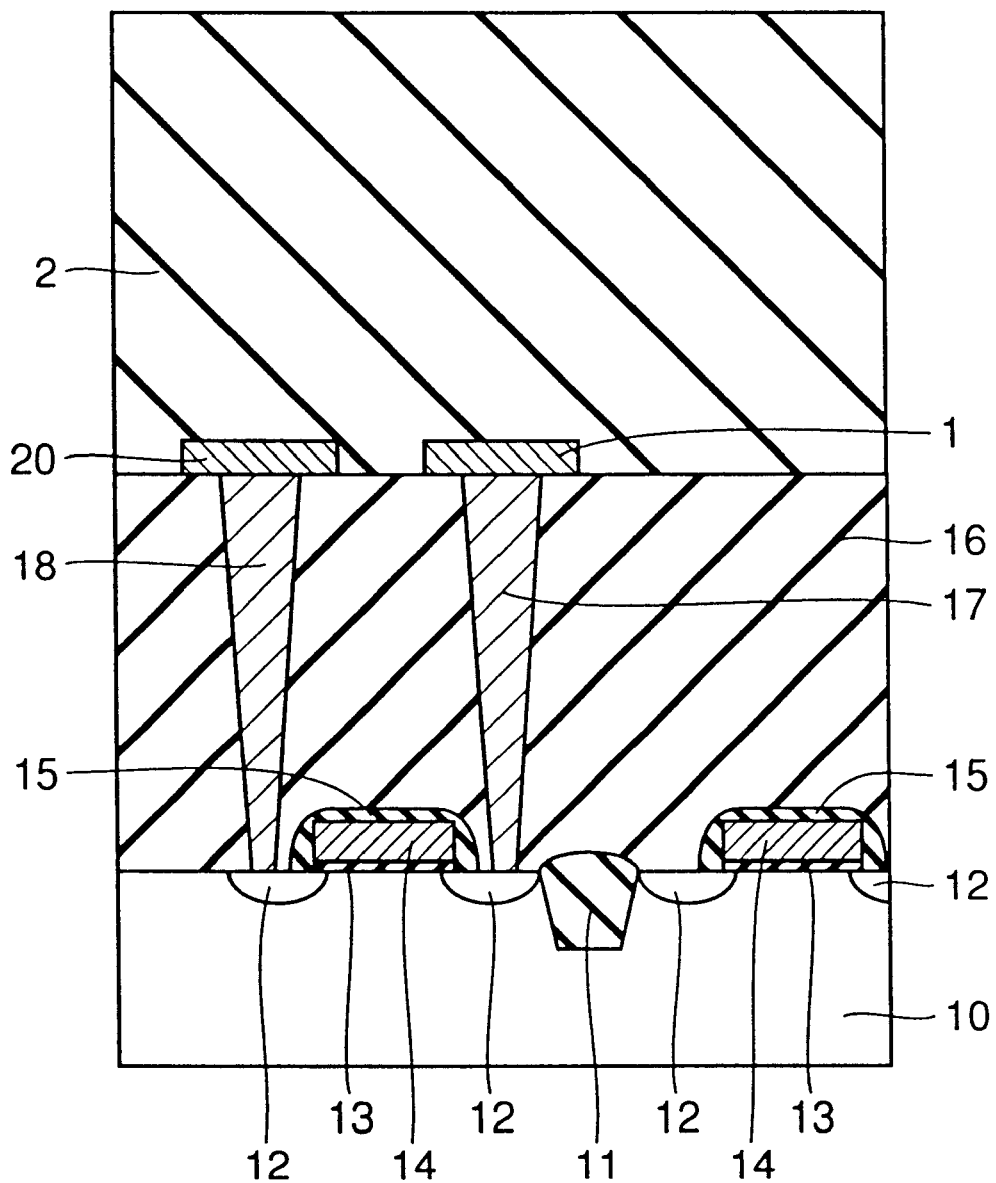
FIGS. 1 to 4 show a semiconductor device manufacturing method employing high-temperature sintering of first, second, third, fourth and fifth embodiments of the invention.

Embodiments of the invention will now be described with reference to the drawings.

(First Embodiment)

A method of manufacturing a semiconductor device of a first embodiment of the invention will now be described with reference to FIGS. 1 to 9. In the semiconductor device manufacturing method of the first embodiment, an element isolating and insulating film 11 is first formed on a semiconductor substrate 10 made of silicon so that element formation regions are formed. Then, a gate insulating film 13 and a gate electrode 14 are formed on semiconductor substrate 10 in the element formation region. Thereafter, source/drain regions 12 located on the opposite sides of gate insulating film 13 and gate electrode 14 are formed at semiconductor substrate 10. Through the steps described above, a field-effect transistor is formed.

Then, processing is performed to form a protective insulating film 15 covering gate insulating film 13 and gate electrode 14. Thereafter, processing is performed to form an interlayer insulating film 16 covering protective insulating film 15, source/drain regions 12 and element isolating and insulating film 11. Then, contact holes reaching source/drain regions 12 are formed in interlayer insulating film 16. Then, processing is performed to form contact plugs 17 and 18, which are made of tungsten and fill the contact holes, respectively.

Then, a tungsten interconnection 1 is formed on contact plugs 17 and 18 as well as interlayer insulating film 16. Contact plug 17 made of tungsten and tungsten interconnection 1 have resistance values, which rise when they are thermally processed for a long time at a temperature exceeding 750° C. Thereafter, the CVD method or sputtering method is performed to form an interlayer insulating film 2, which is made of a silicon oxide film or a silicon nitride film, and covers tungsten interconnection 1. Thereby, the structure shown in FIG. 1 is completed.

Figure 2:
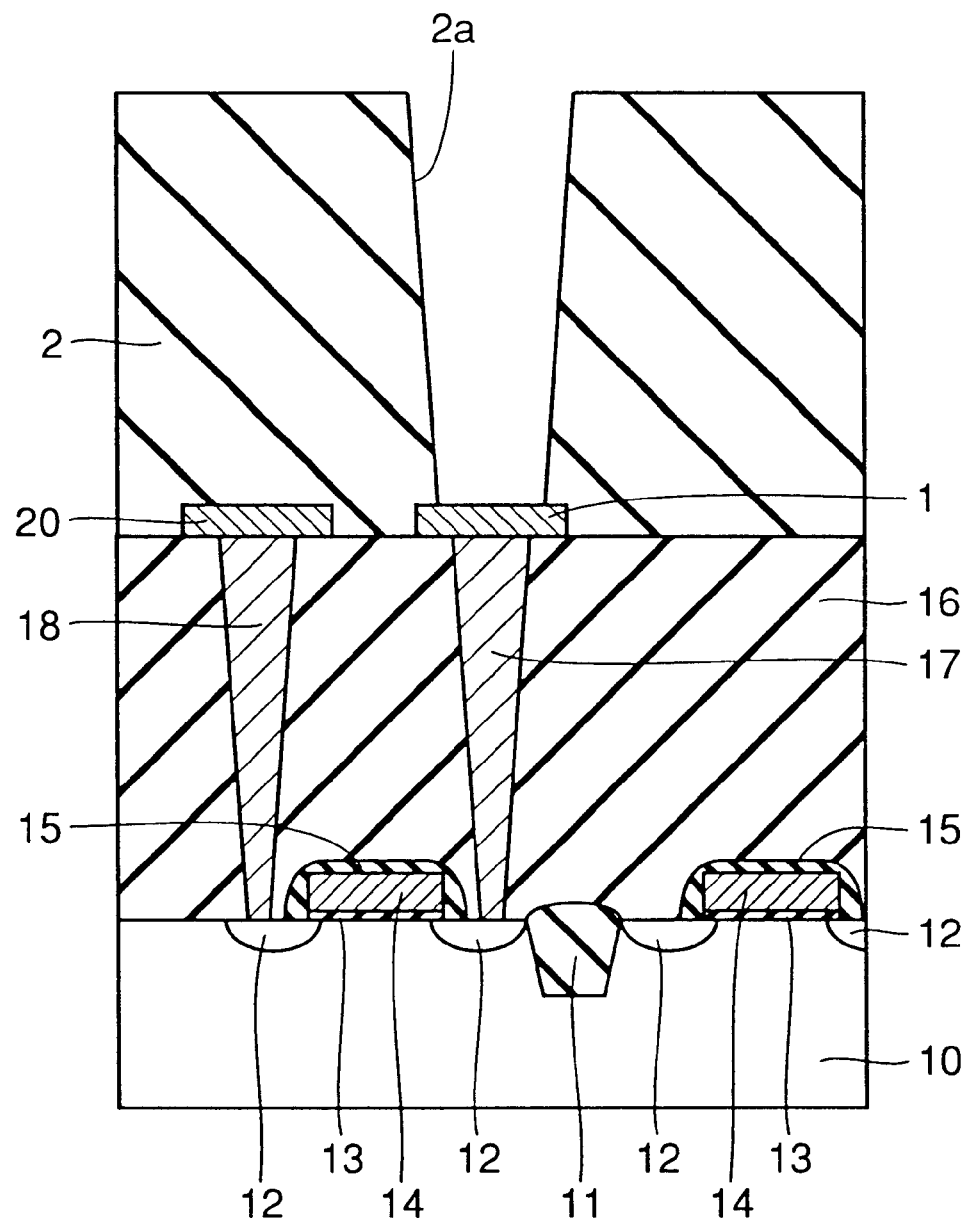

Then, as shown in FIG. 2, a contact hole 2a reaching tungsten interconnection 1 is formed in interlayer insulating film 2 by the lithography technique or dry etching technique. In the state shown in FIG. 2, gate insulating film 13 of the transistor is then subjected to high-temperature sintering at a temperature from 450° C. to 600° C. within a hydrogen atmosphere. Thereby, gate insulating film 13 itself of the transistor recovers from process damages applied in the preceding steps, and the interface level is recovered on the interface between gate insulating film 13 and semiconductor substrate 10 as well as the interface between gate insulating film 13 and gate electrode 14. Thus, hydrogen atoms enter dangling bonds occurred on these interfaces, and thereby remove crystal defects.

Figure 3:
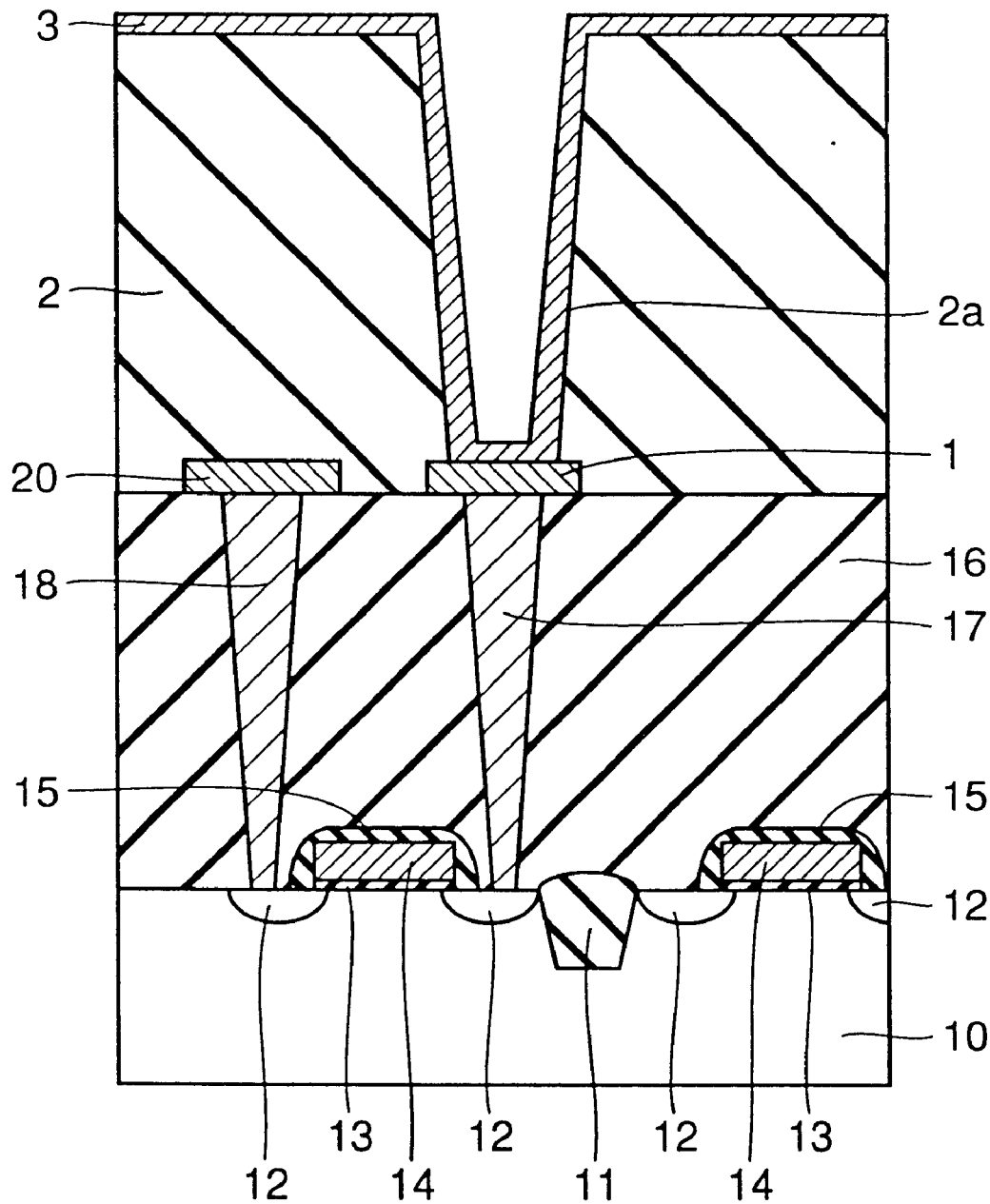

As shown in FIG. 3, the CVD method or sputtering method is then performed to form a barrier metal film 3 made of titanium nitride over the surface of contact hole 2a and the upper surface of interlayer insulating film 2.

Figure 4:
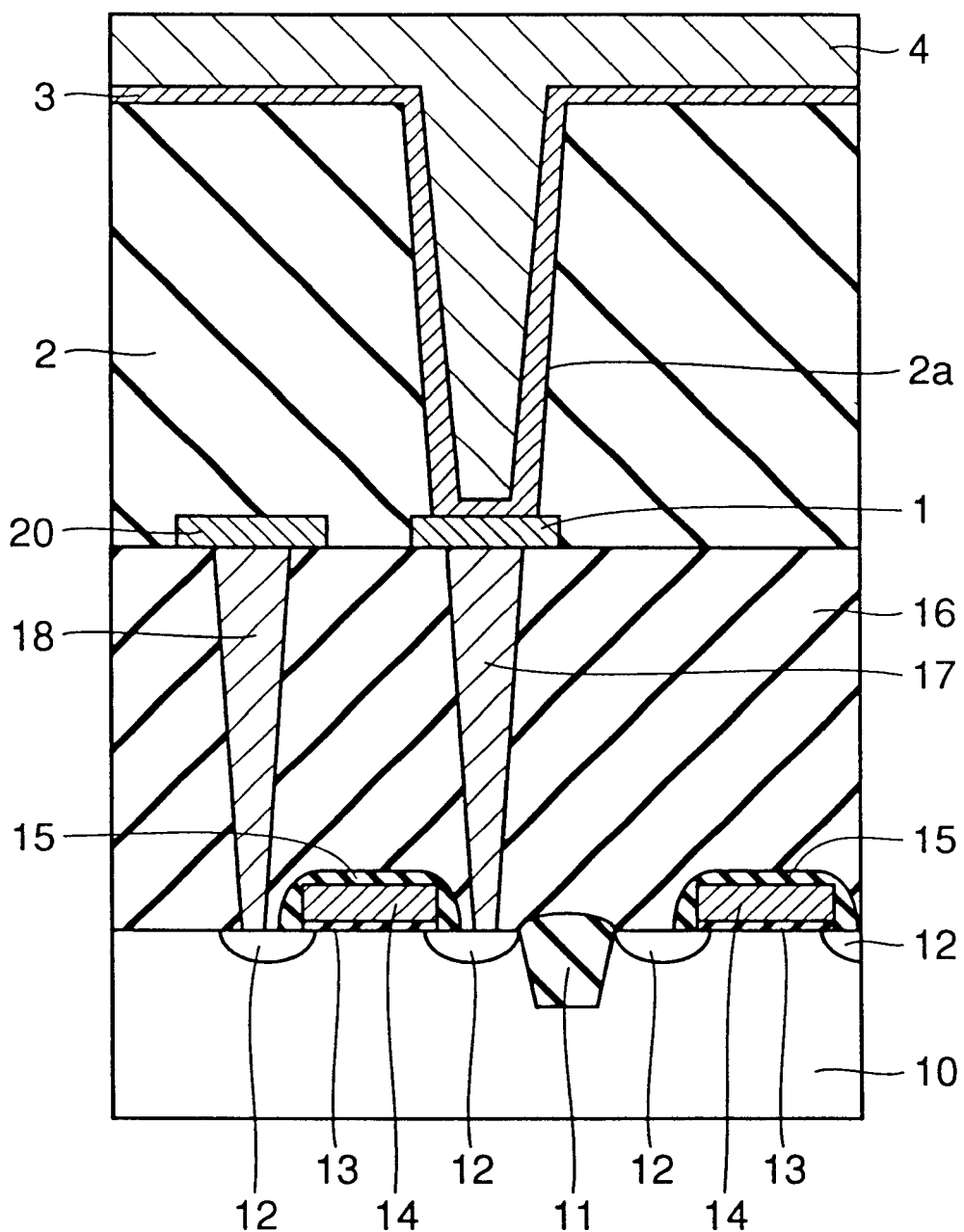

Thereafter, as shown in FIG. 4, the CVD method is performed to form a tungsten film 4, which fills concavities formed by barrier metal film 3 and is located over barrier metal film 3 on interlayer insulating film 2.

Figure 5:
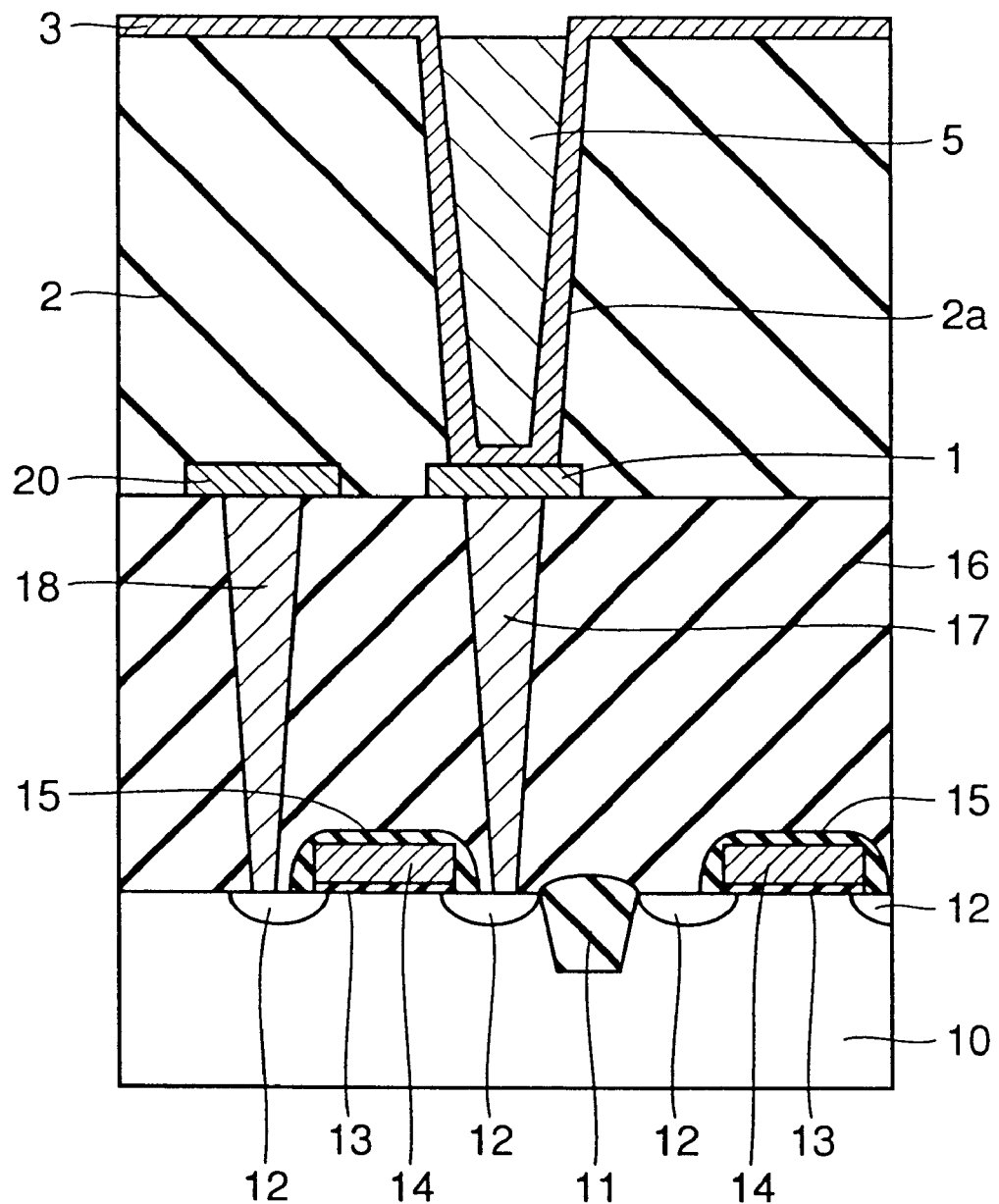
FIGS. 5 to 9 show the semiconductor device manufacturing method employing the high-temperature sintering of the first, second and third embodiments of the invention.
Figure 6:
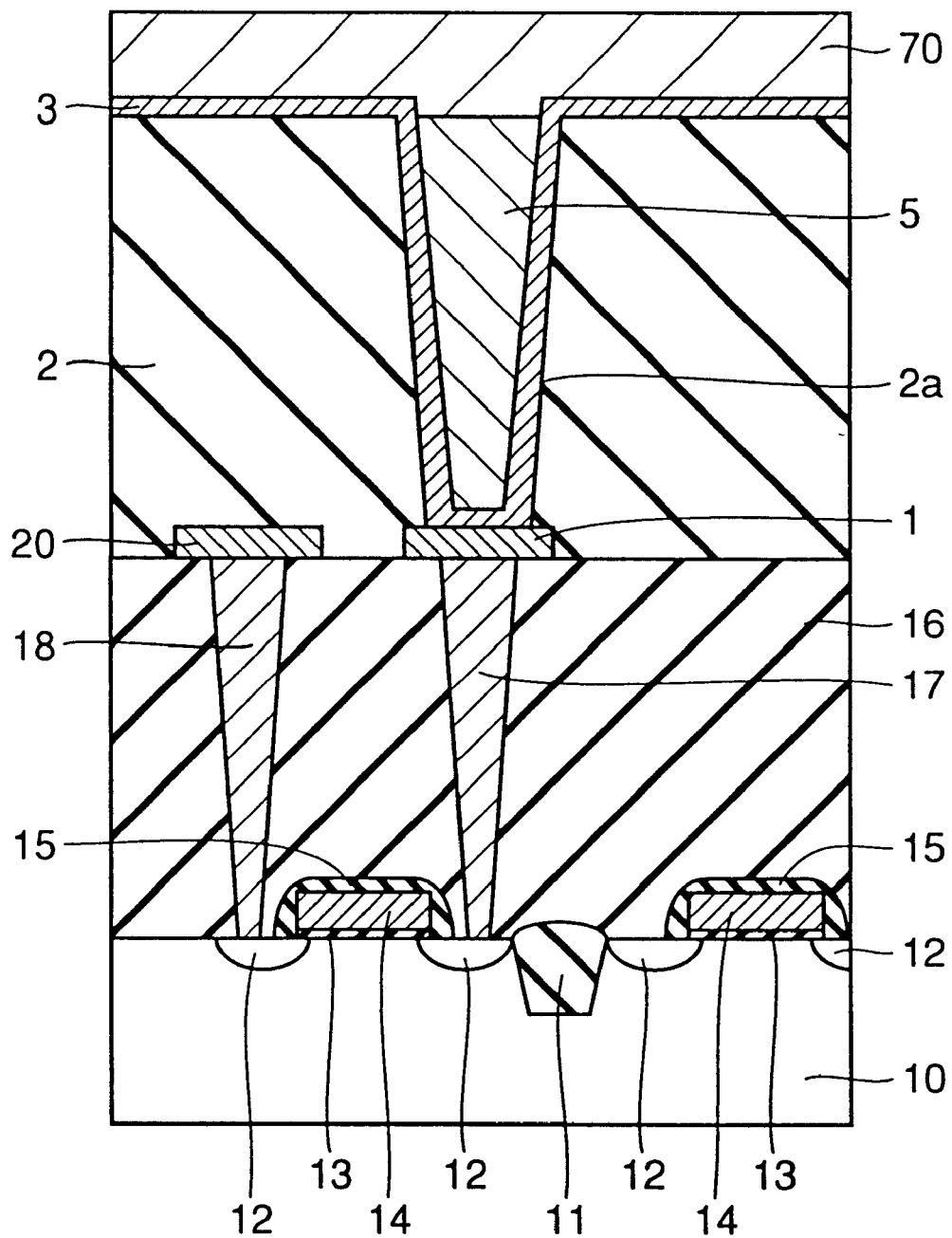

Then, as shown in FIG. 5, CMP, dry etching or wet etching is effected on tungsten film 4 to form a tungsten plug 5 which is left only in the concavity formed by barrier metal film 3. Thereafter, as shown in FIG. 6, the CVD method or sputtering method is performed to form an aluminum film 70 covering tungsten plug 5 and barrier metal film 3.

Figure 7:
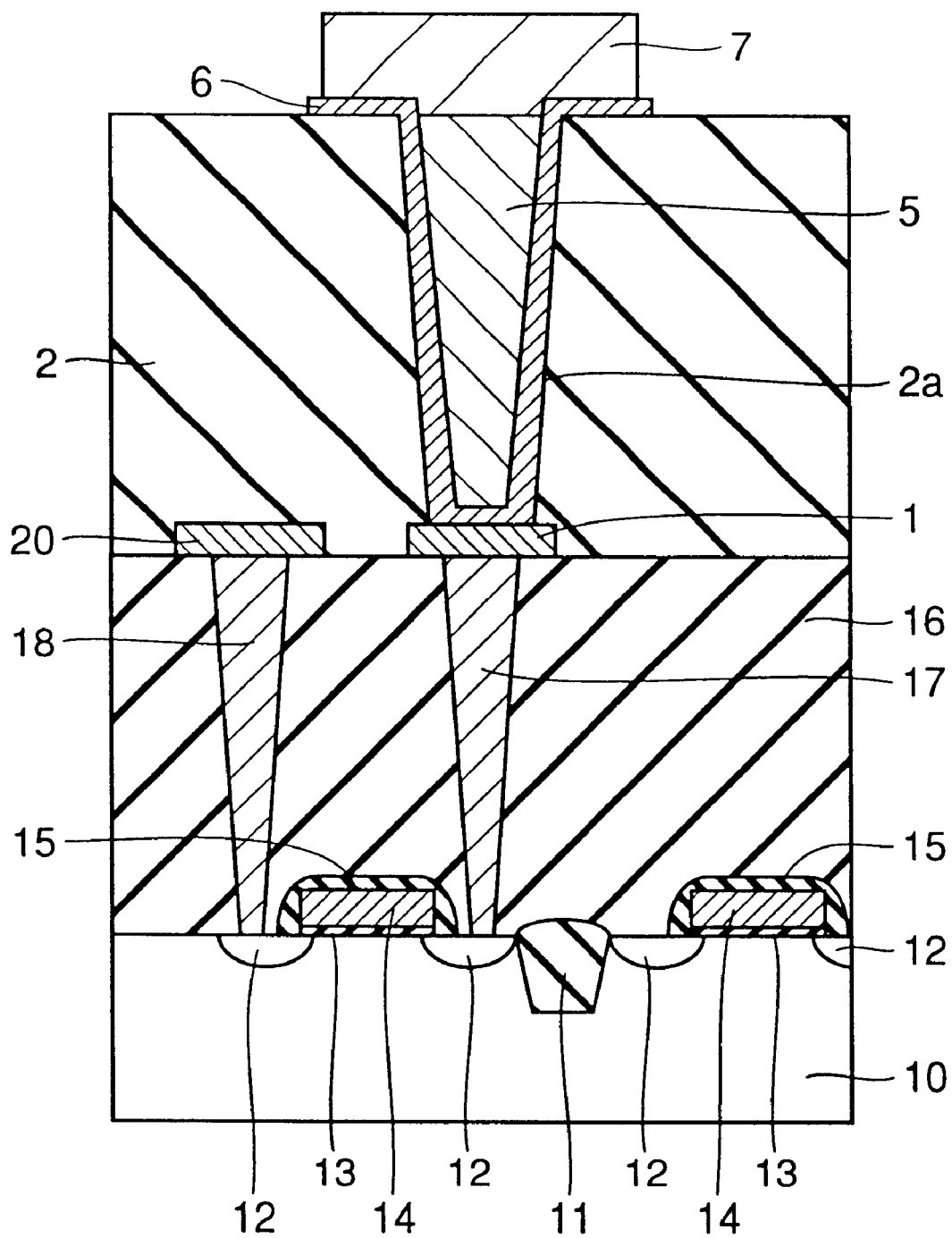

After a subsequent lithography step, dry etching is effected on aluminum film 70 and barrier metal film 3 to form an aluminum film 7 and a barrier metal film 6 as shown in FIG. 7. If aluminum film 7 were thermally processed at a temperature of 450° C. or more, crystal defects would occur. If necessary in the state shown in FIG. 7, sintering within a hydrogen atmosphere at a temperature from 370° C. to 430° C. is effected on gate insulating film 13 so that a hillock of aluminum and a crack in the interlayer insulating film may not occur, similarly to the method of manufacturing the semiconductor device in the prior art.

Figure 8:
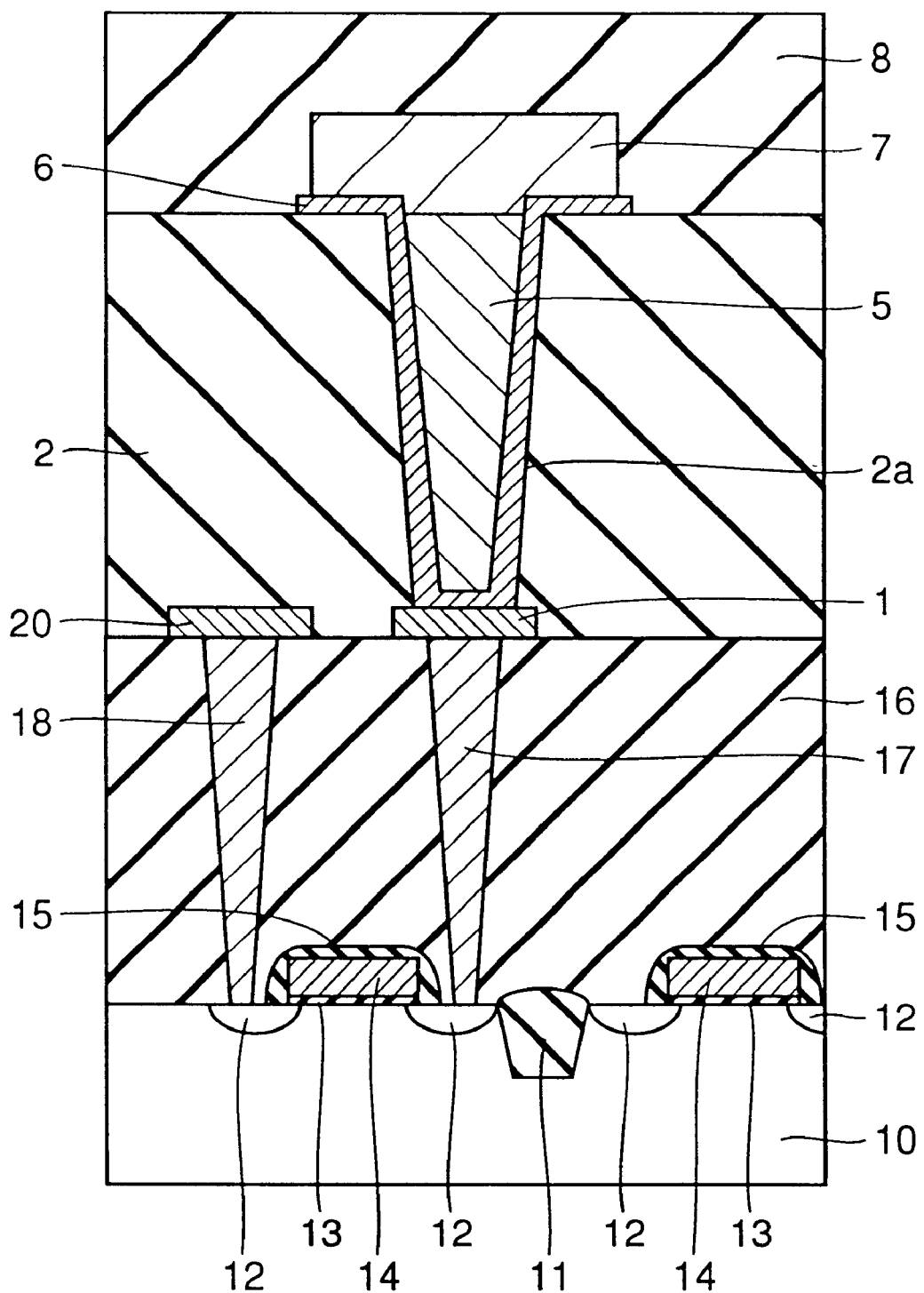
Figure 9:
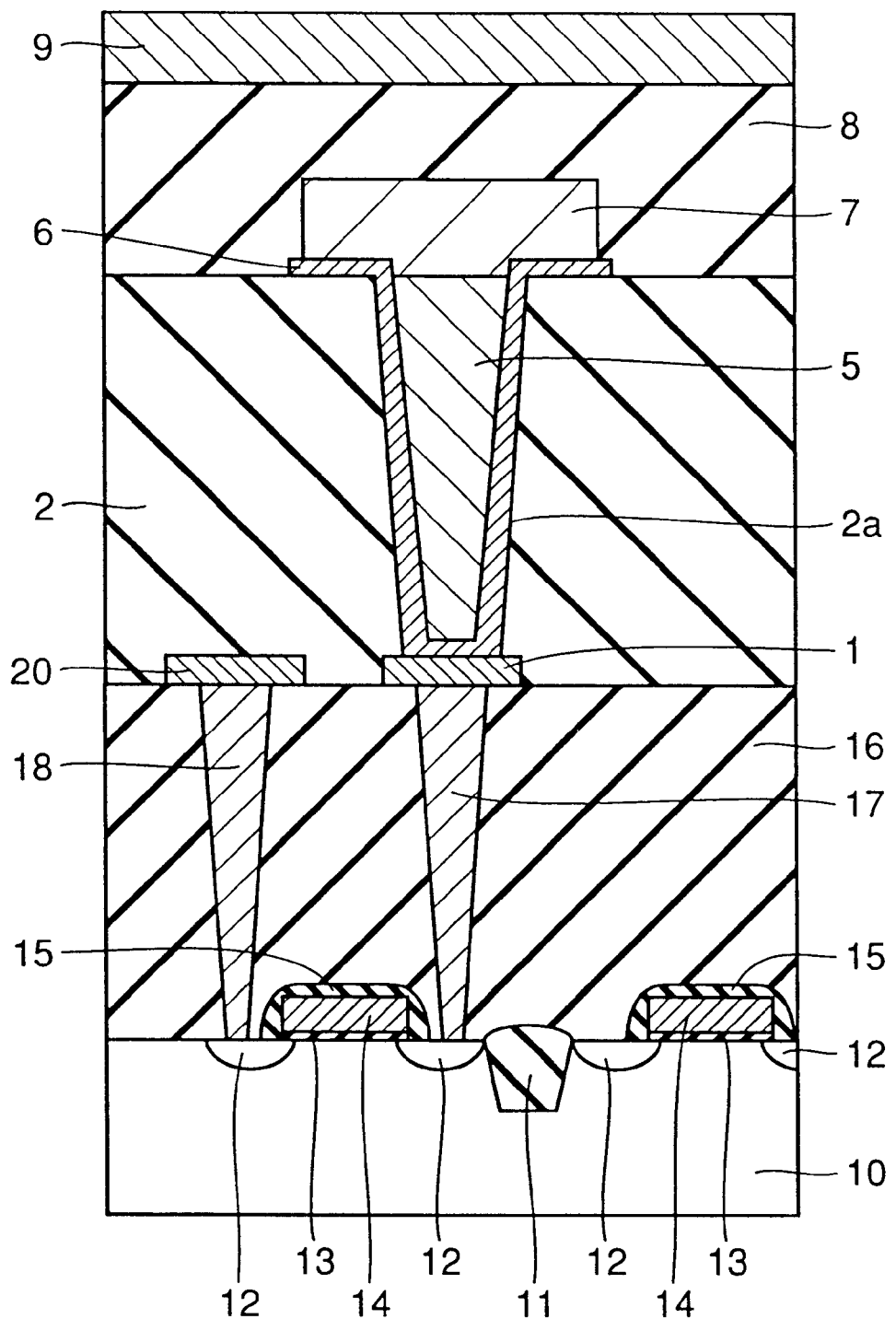

As shown in FIG. 8, an interlayer insulating film 8 is then formed over aluminum film 7 and barrier metal film 6. Then, the CVD method or sputtering method is performed to form an aluminum film 9 on interlayer insulating film 8 as shown in FIG. 9. Crystal defects would occur in aluminum film 9 if it were thermally processed at a temperature of 450° C. or more. If necessary in the state shown in FIG. 9, sintering is likewise effected on gate insulating film 13 within a hydrogen atmosphere in a temperature range from 370° C. to 430° C. so that a hillock of aluminum and a crack in the interlayer insulating film may not occur.

By using the above manufacturing method, gate insulating film 13 of the transistor can recover from the process damages and a thermal stress, and the sintering is performed for recovery from the interface levels occurred on the interface between gate insulating film 13 and the gate electrode as well as the interface between gate insulating film 13 and semiconductor substrate 10. This sintering is high-temperature sintering, i.e., the sintering performed in a range from 450° C. to 600° C. Therefore, it is possible to perform better recovery from the process damage and the thermal stress applied to gate insulating film 13 of the transistor as well as the interface levels occurred on the interface between gate insulating film 13 and the gate electrode and the interface between gate insulating film 13 and semiconductor substrate 10. The high-temperature sintering is performed before formation of aluminum films 7 and 9, in which crystal defects would occur if thermally processed at a temperature of 450° C. or more. Accordingly, the sintering does not cause a hillock in aluminum interconnections 7 and 9. Consequently, it is possible to manufacture semiconductor device, in which gate insulating film 13 of the transistor can sufficiently recover from process damages and others, without causing disadvantages in aluminum interconnections 7 and 9.

According to the above manufacturing method, the high-temperature sintering is performed before formation of interlayer insulating film 8. Consequently, it is possible to prevent a crack in interlayer insulating film 8, which would occur if the high-temperature sintering were performed after formation of interlayer insulating film 8.

If the temperature exceeds 750° C., the contact resistance value generally increases in the contact portions between contact plug 17 made of tungsten and source/drain regions 12. According to the method of manufacturing the semiconductor device of the embodiment, however, the high-temperature sintering is performed in the range from 450° C. to 600° C., and therefore it is possible to suppress the adverse effect by the high-temperature sintering, i.e., disadvantageous increase in contact resistance value in the contact portions between contact plug 17 and source/drain regions 12. Consequently, it is possible to form a contact plug 17 having a good conductivity.

Since barrier metal film 6 is formed between tungsten interconnection 1 and aluminum interconnection 7, it is possible to suppress mutual diffusion and others which may occur between tungsten interconnection 1 and aluminum interconnection 7.

(Second Embodiment)

A method of manufacturing a semiconductor device of a second embodiment of the invention will now be described below with reference to FIGS. 1 to 9. According to the method of manufacturing the semiconductor device of this embodiment, the step of forming contact hole 2a and the steps preceding it are the same as those in the semiconductor device manufacturing method of the first embodiment. In the first embodiment already described, the high-temperature sintering is effected in the state shown in FIG. 2, and more specifically is effected on gate insulating film 13 of the transistor within the hydrogen atmosphere in the temperature range from 450° C. to 600° C. so that gate insulating film 13 may recover from process damages and others which have been applied in the preceding steps. In this second embodiment, however, the sintering is not performed in the above point of time, and barrier metal film 3 made of titanium nitride is formed over the surface of contact hole 2a and the upper surface of interlayer insulating film 2 by the CVD method or sputtering method, similarly to the first embodiment.

In the state shown in FIG. 3, high-temperature sintering is then effected on gate insulating film 13 of the transistor in the hydrogen atmosphere at a temperature from 450° C. to 600° C. so that gate insulating film 13 recovers from damages which were applied in the preceding steps. Thereafter, the semiconductor wafer is cooled until barrier metal film 3 reaches 200° C. This cooling is performed by a device which can cool the wafer in a non-oxidizing atmosphere of a nitrogen gas or an argon gas. This achieves recovery from process damages and others which were applied to gate insulating film 13 of the transistor in the preceding steps, and also achieves recovery from the interface levels occurred on the interface between the gate electrode and gate insulating film 13 as well as the interface between gate insulating film 13 and semiconductor substrate 10. In this processing, the non-oxidizing atmosphere is kept until the wafer temperature lowers to 200° C. or less for the purpose of preventing oxidization of barrier metal film 3.

As shown in FIG. 4, the CVD method is then performed to fill the concavity formed by barrier metal film 3, and tungsten film 4 is formed over barrier metal film 3 on interlayer insulating film 2. The steps described above are performed similarly to those in the semiconductor device manufacturing method shown in FIGS. 5 to 9.

According to the manufacturing method described above, the high-temperature sintering brings about recovery of gate insulating film 13 of the transistor from process damages and others before formation of aluminum interconnections 7 and 9 as well as interlayer insulating film 8, as can be done also in the semiconductor device manufacturing method of the first embodiment. Therefore, the manufacturing method described above can provide the semiconductor device, in which good recovery from process damages and others is made while preventing a hillock of aluminum interconnections 7 and 9 as well as a crack in interlayer insulating film 8, similarly to the semiconductor device manufacturing method of the first embodiment.

Since the method includes the cooling step using the device which can perform the cooling in the non-oxidizing atmosphere until the wafer temperature reaches 200° C., oxidization of barrier metal film 6 is suppressed. Since oxidization of the surface of barrier metal film 6 is suppressed, contact plug 5 and tungsten interconnection 7 each having a uniform thickness can be formed on the surface of barrier metal film 6. Consequently, it is possible to provide the semiconductor device in which contact plug 5 and tungsten interconnection 7 have improved electrical conductivity.

(Third Embodiment)

A method of manufacturing a semiconductor device of a third embodiment of the invention will now be described below with reference to FIGS. 1 to 9. According to the method of manufacturing the semiconductor device of this embodiment, the step of forming contact hole 2a and the steps preceding it are the same as those in the semiconductor device manufacturing method of the first and second embodiments. Since interlayer insulating film 2 has a high moisture absorbing property, it may contain moisture, in which case interlayer insulating film 2 is thermally processed at a temperature from 350° C. to 750° C.

Thereby, it is possible to suppress peeling of barrier metal layer 3, which will be formed in the subsequent step, from the surface of interlayer insulating film 2. Similarly to the step in the first and second embodiments, the CVD method or sputtering method is then performed to form barrier metal film 3, which is made of titanium nitride, over the surface of contact hole 2a and the upper surface of interlayer insulating film 2.

Thereafter, processing is performed similarly to that which is effected on the state shown in FIG. 3 in the semiconductor device manufacturing method of the second embodiment. More specifically, the high-temperature sintering is effected on the transistor in the hydrogen atmosphere at the temperature from 450° C. to 600° C., and then the transistor is cooled in the non-oxidizing atmosphere until the temperature of tungsten interconnection 1 and barrier metal film 3 lowers to or below 200° C. Thereby, gate insulating film 13 of the transistor recovers from process damages which were applied in the preceding steps. Also, the cooling brings about recovery from the interface levels occurred on the interface between the gate electrode and gate insulating film 13 as well as the interface between gate insulating film 13 and semiconductor substrate 10. The purpose of cooling the semiconductor wafer in the non-oxidizing atmosphere until the wafer temperature lowers to or below 200° C. is to prevent oxidization of barrier metal film 3.

Thereafter, the concavities formed by barrier metal film 3 are filled by the CVD method as shown in FIG. 4, and tungsten film 4 is formed over barrier metal film 3 on interlayer insulating film 2. The steps after the above are performed in the same manner as those in the semiconductor device manufacturing method of the first and second embodiments already described with reference to FIGS. 5–9.

By the foregoing manufacturing method, the high-temperature sintering brings about recovery of gate insulating film 13 of the transistor from process damages and others before formation of aluminum interconnections 7 and 9 as well as interlayer insulating film 8, similarly to the semiconductor device manufacturing methods of the first and second embodiments. Accordingly, the manufacturing method of this embodiment can provide the semiconductor device, in which good recovery from the process damages and others is made while preventing occurrence of a hillock and a crack in interlayer insulating film 8.

In the state shown in FIG. 2, interlayer insulating film 2 is thermally processed at the temperature from 350° C. to 750° C. so that the moisture is removed from interlayer insulating film 2. Therefore, it is possible to prevent peeling of barrier metal film 3, which will be formed in the subsequent step, from the surface of interlayer insulating film 2. Accordingly, the semiconductor device having improved reliability can be manufactured.

(Fourth Embodiment)

A method of manufacturing a semiconductor device of a fourth embodiment of the invention will now be described below with reference to FIGS. 1 to 4 and FIGS. 10 to 14. According to the semiconductor device manufacturing method of this embodiment, the step of forming tungsten interconnections 1 and 20 on contact plugs 17 and 18 made of tungsten and the steps preceding it are performed in the same manner as those in the semiconductor device manufacturing method of the first to third embodiments. The resistance values of contact plug 17 made of tungsten and tungsten interconnection 1 rise when these are thermally processed for a long time at a temperature exceeding 750° C., as already stated in the semiconductor device manufacturing methods of the first to third embodiments. Thereafter, interlayer insulating film 2 made of a silicon oxide film or a silicon nitride film is formed over tungsten interconnection 1 by the CVD or sputtering method. Thereby, the structure shown in FIG. 1 is completed.

As shown in FIG. 2, contact hole 2a reaching tungsten interconnection 1 is then formed in interlayer insulating film 2 by the lithography technique and dry etching technique. As shown in FIG. 3, the CVD or sputtering method is then performed to form barrier metal film 3 made of titanium nitride over the surface of contact hole 2a and the upper surface of interlayer insulating film 2. Thereafter, the concavities formed by barrier metal film 3 are filled by the CVD method as shown in FIG. 4, and tungsten film 4 is formed over barrier metal film on interlayer insulating film 2.

Then, the CMP, dry etching or wet etching is effected on tungsten film 4 and barrier metal film 3 to form tungsten plug 5 and barrier metal film 6 remaining only in contact hole 2a.

Figure 10:
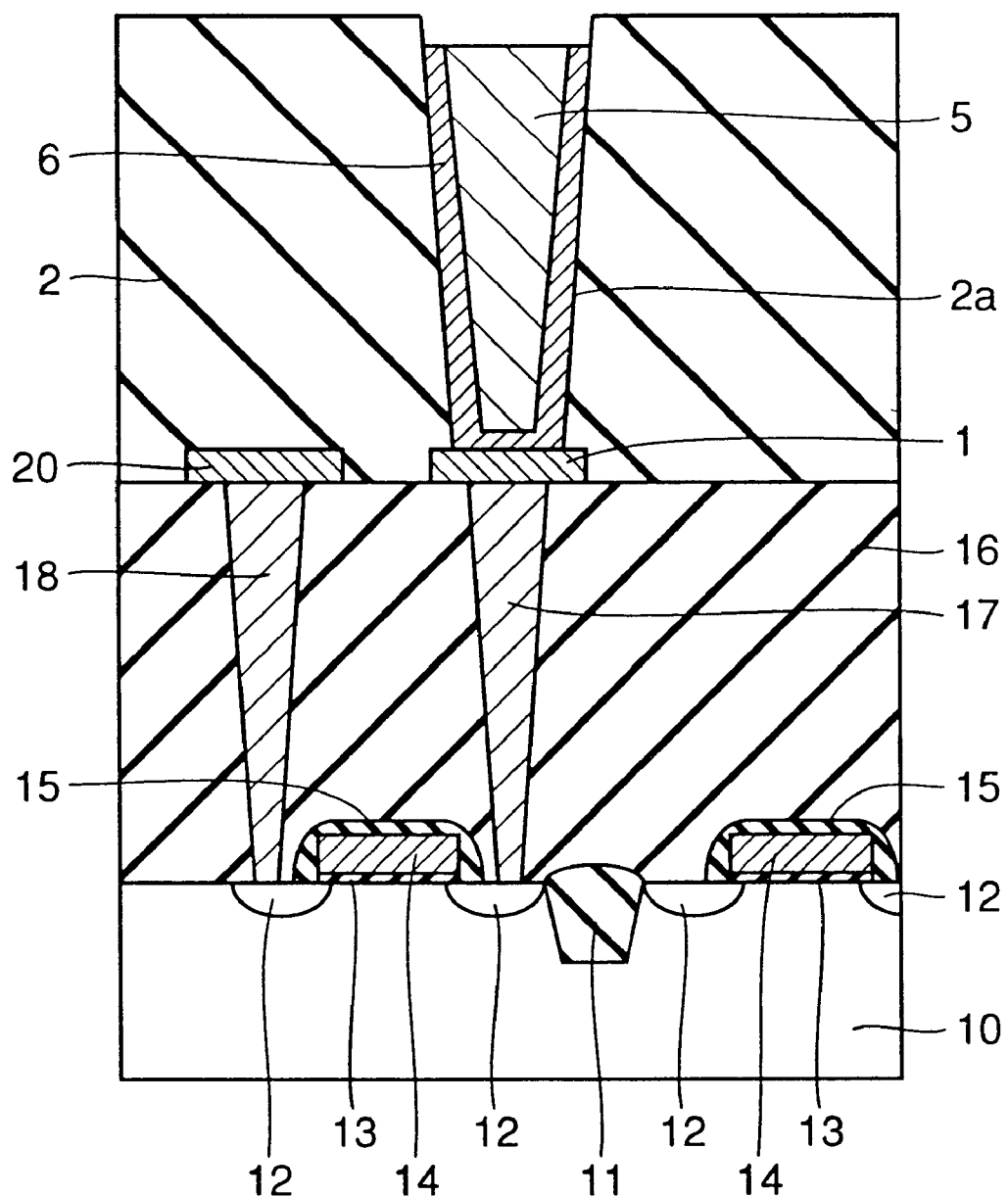
FIGS. 10 to 14 show the semiconductor device manufacturing method employing the high-temperature sintering of the fourth and fifth embodiments of the invention.

In the state shown in FIG. 10, the high-temperature sintering is then effected on gate insulating film 13 of the transistor in the hydrogen atmosphere at a temperature from 450° C. to 600° C. Thereby, gate insulating film 13 of the transistor recovers from the process damages which were applied in the preceding steps, and the structure also recovers from interface levels occurred on the interface between the gate electrode and gate insulating film 13 as well as the interface between gate insulating film 13 and semiconductor substrate 10.

Figure 11:
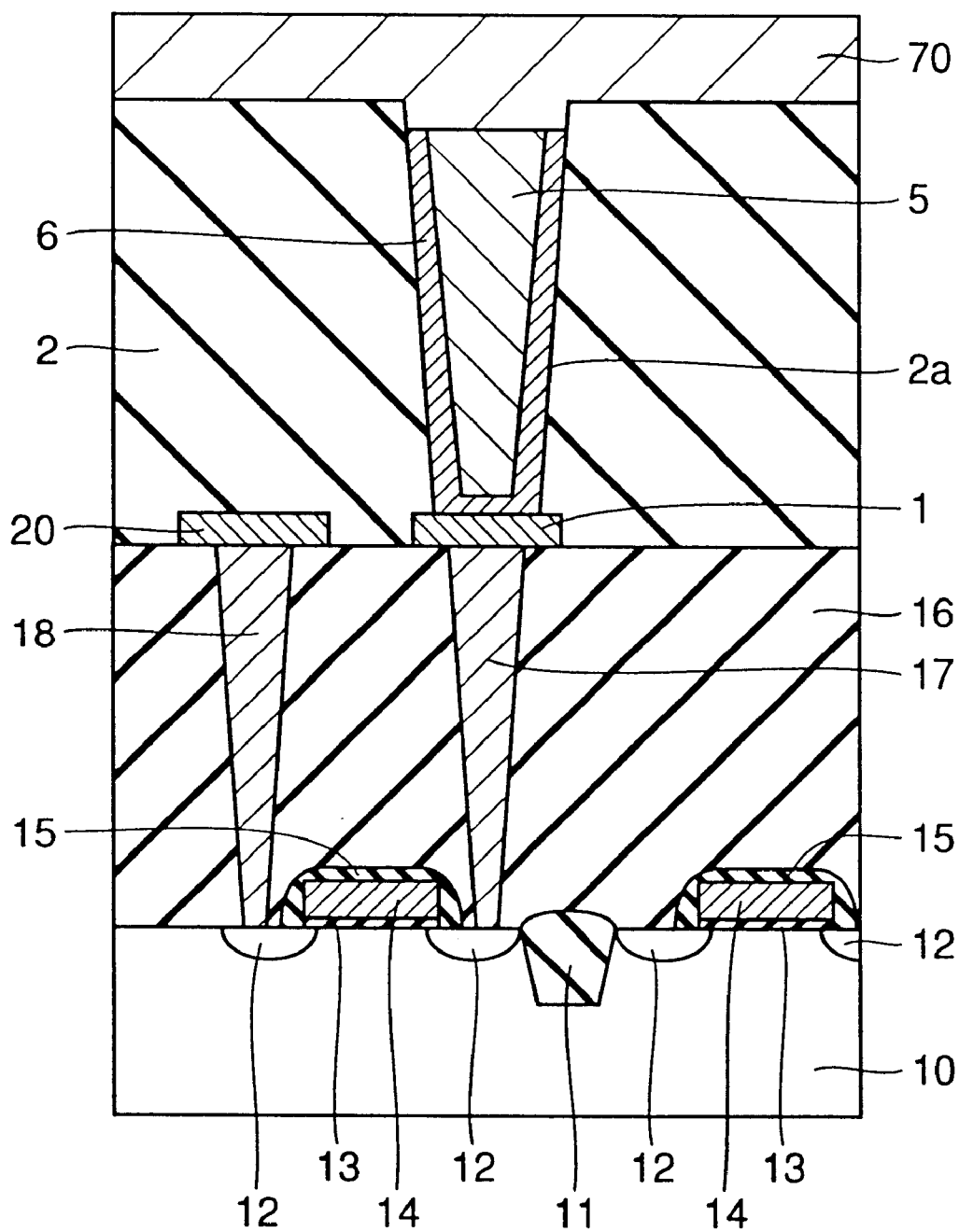

Then, the CVD or sputtering method is performed to form an aluminum film 70 covering the upper surface of interlayer insulating film 2 and the upper surfaces of tungsten plug 5 and barrier metal film 3, as shown in FIG. 11.

Figure 12:
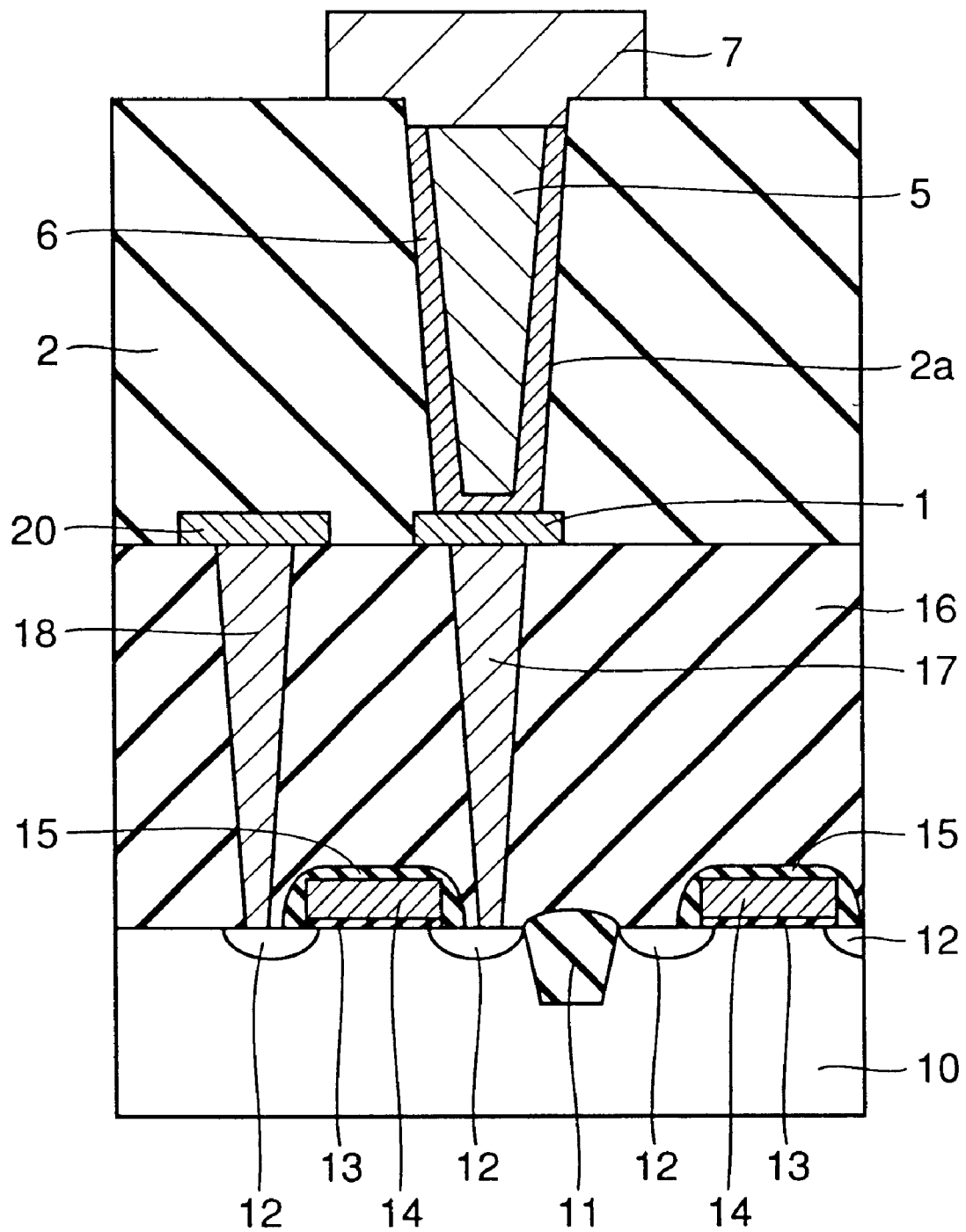

After the subsequent lithography step, dry etching is effected on aluminum film 70 to form aluminum film 7 as shown in FIG. 12. If aluminum film 7 were thermally processed at a temperature of 450° C. or more, crystal defects would occur. If necessary in the state shown in FIG. 7, sintering within a hydrogen atmosphere in a temperature range from 370° C. to 430° C. is effected on gate insulating film 13 so that a hillock of aluminum and a crack in the interlayer insulating film may not occur, similarly to the conventional semiconductor device manufacturing method already described.

Figure 13:
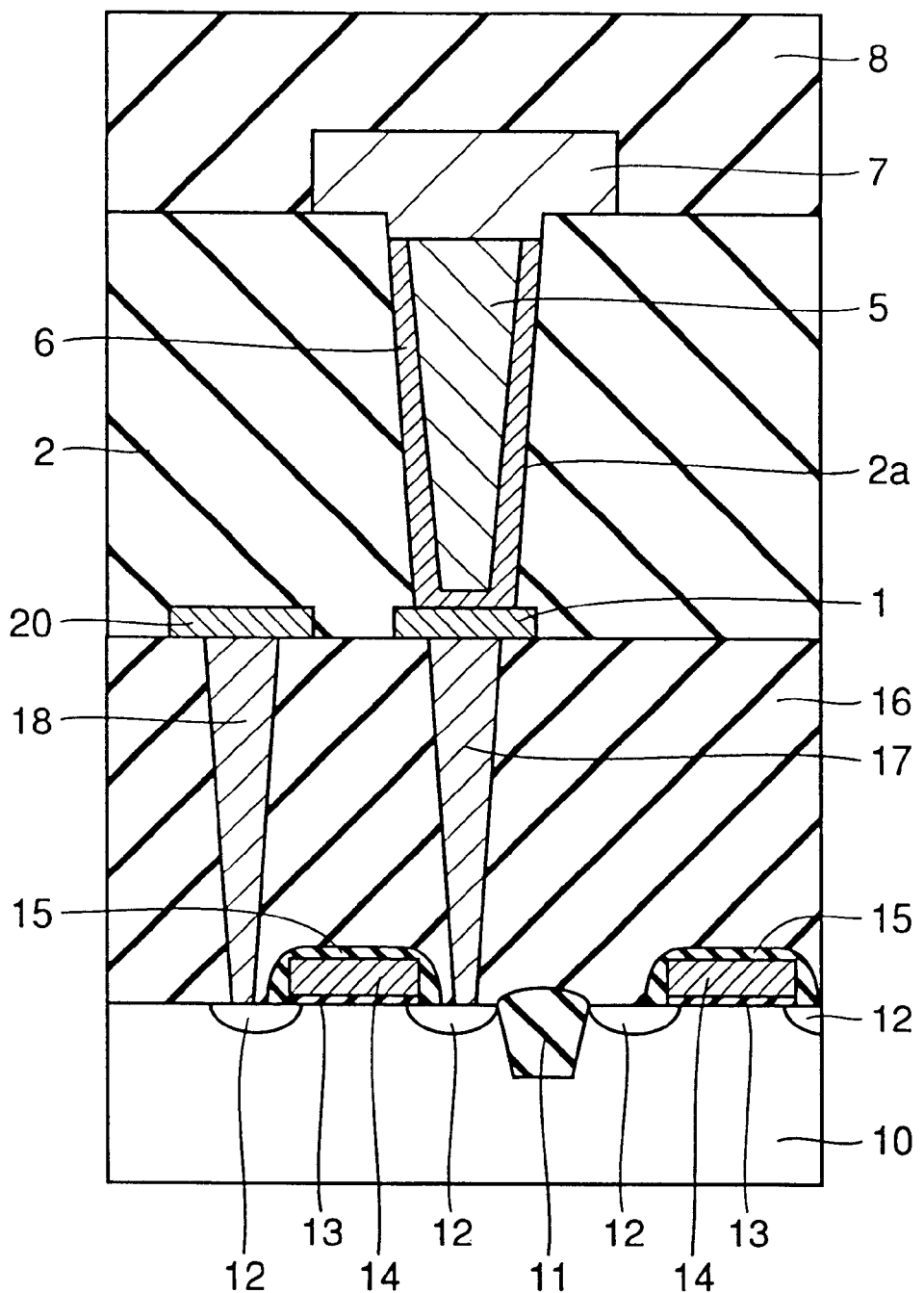
Figure 14:
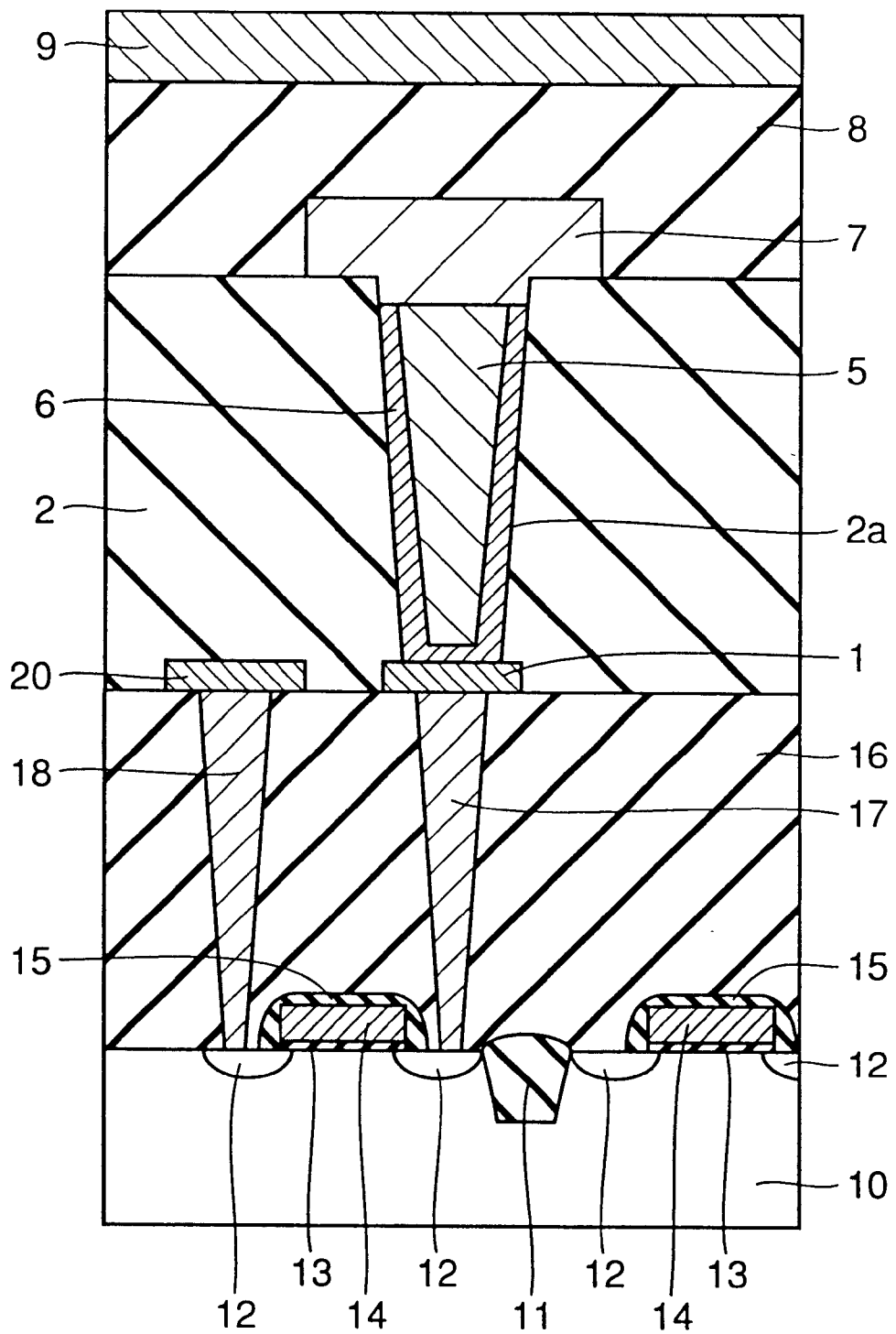
Figure 15:
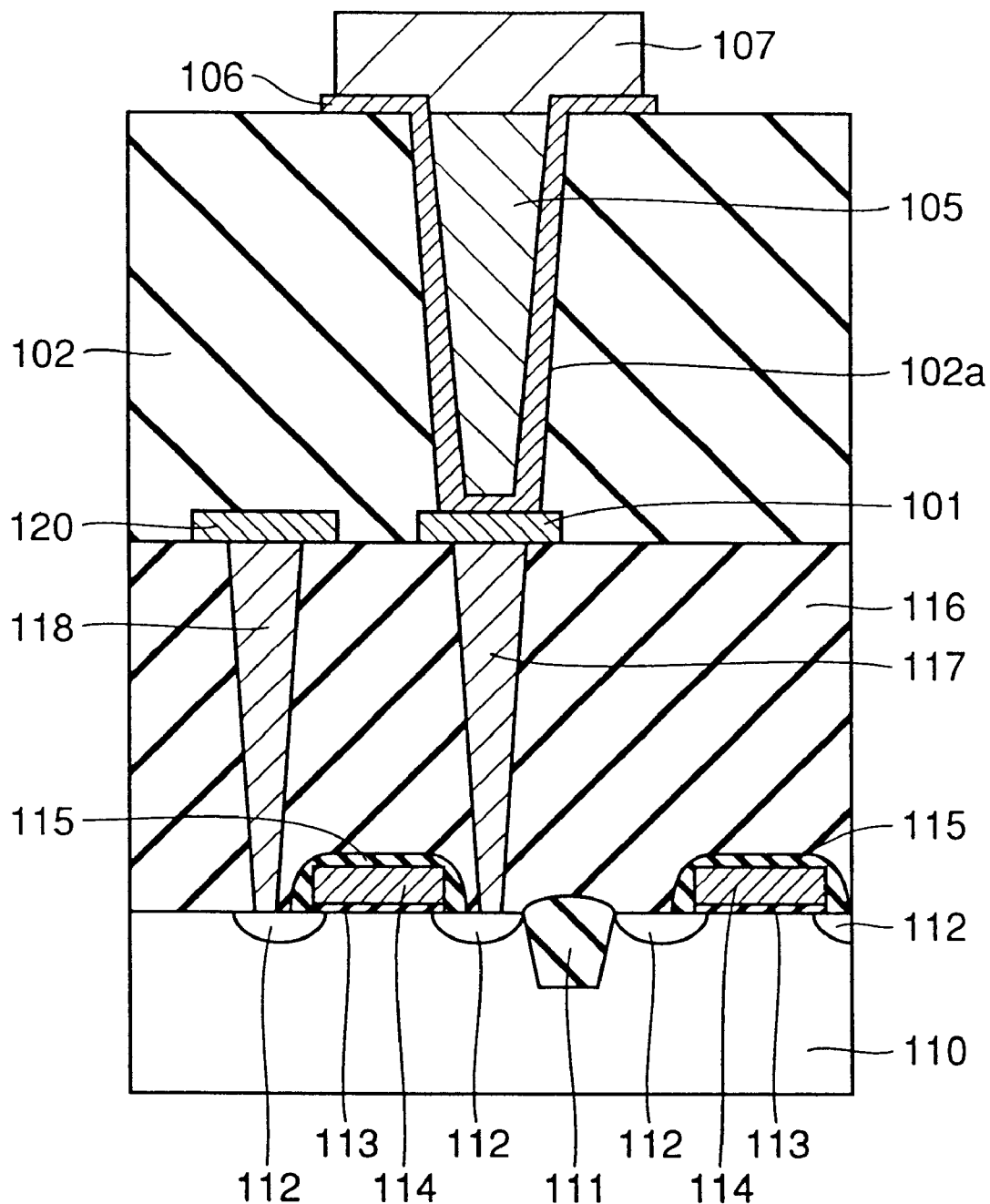
FIGS. 15, 16 and 17 show a semiconductor device manufacturing method employing conventional sintering.
Figure 16:
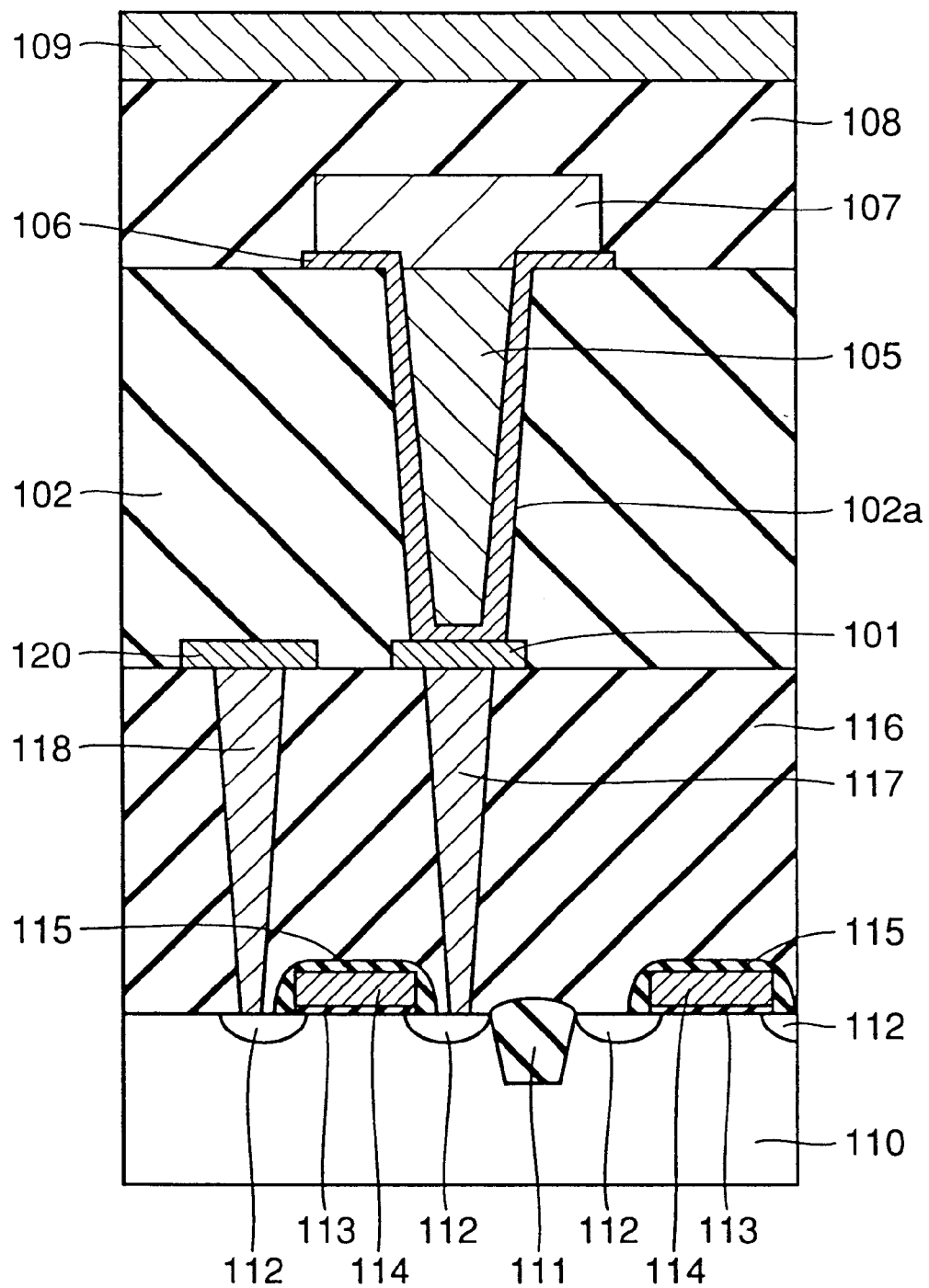
Figure 17:
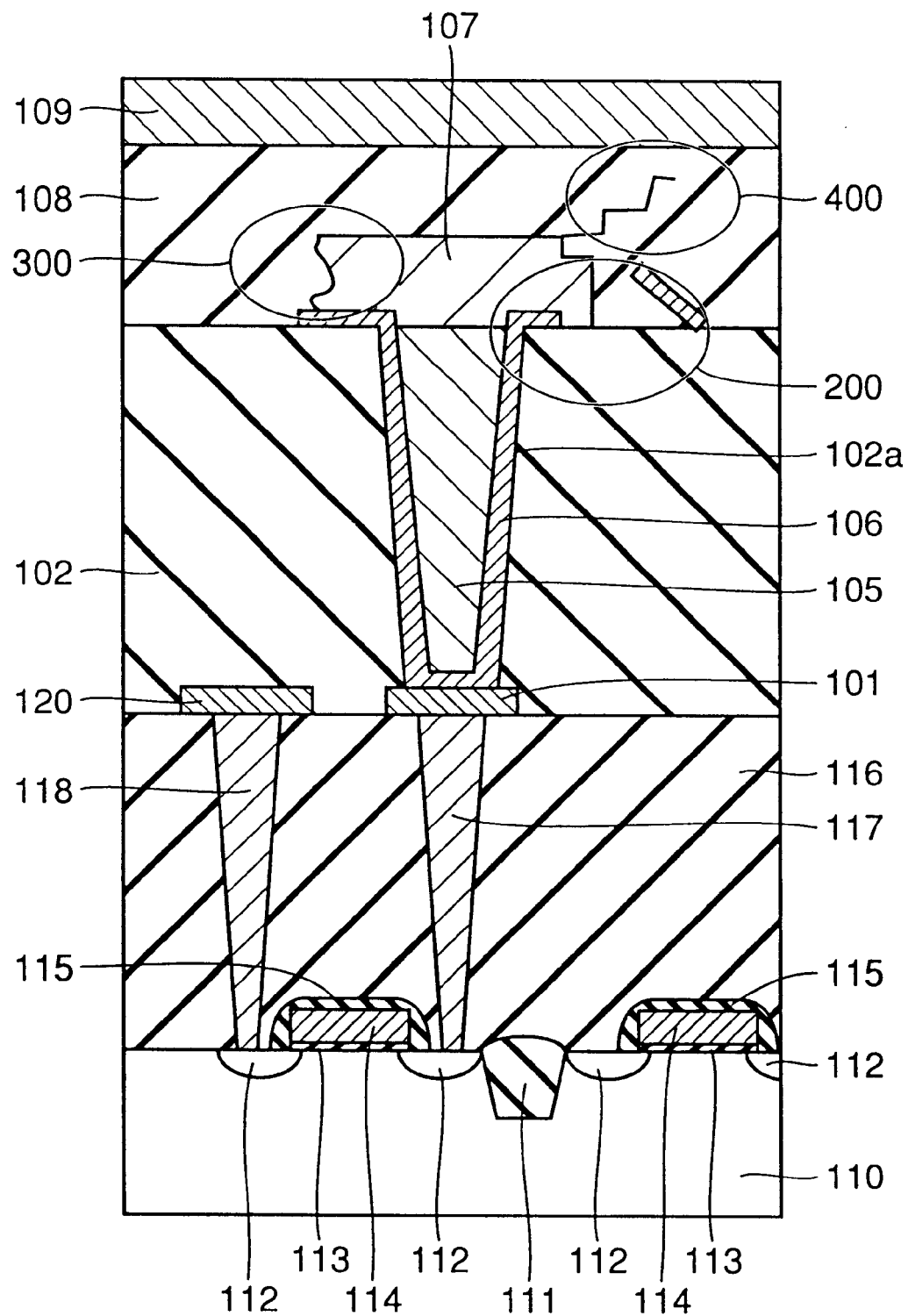

As shown in FIG. 13, interlayer insulating film 8 is then formed over aluminum film 7 and barrier metal film 6. Then, the CVD method or sputtering method is performed to form aluminum interconnection layer 9 on interlayer insulating film 8 as shown in FIG. 14. Crystal defects would occur in aluminum film 9 if it were thermally processed at a temperature of 450° C. or more. If necessary in the state shown in FIG. 14, sintering within a hydrogen atmosphere in a temperature range from 370° C. to 430° C. is effected on gate insulating film 13 so that a hillock of aluminum and a crack in the interlayer insulating film may not occur, similarly to the conventional semiconductor device manufacturing method already described.

By using the above manufacturing method, the high-temperature sintering brings about recovery of gate insulating film 13 of the transistor from the process damages and others before formation of aluminum interconnections 7 and 9 as well as interlayer insulating film 8 during the manufacturing steps, similarly to the semiconductor device manufacturing methods of the first, second and third embodiments. Accordingly, the above manufacturing method can provide the semiconductor device which can sufficiently recover from the process damages and others while preventing occurrence of a hillock of aluminum interconnection 7 and a crack in interlayer insulating film 8.

Since barrier metal film 6 is not formed on the upper surface of interlayer insulating film 2, i.e., the portion on which peeling is likely to occur, disadvantages due to peeling of barrier metal film 6 do not occur. As a result, the semiconductor device having improved reliability can be manufactured.

(Fifth Embodiment)

A method of manufacturing a semiconductor device of a fifth embodiment of the invention will now be described below with reference to FIGS. 1 to 4 and FIGS. 10 to 14. According to the semiconductor device manufacturing method of this embodiment, the step of forming contact hole 2a and the steps preceding it are performed in the same manner as those in the semiconductor device manufacturing method of the fourth embodiment. If interlayer insulating film 2 has a high moisture absorbing property, interlayer insulating film 2 is thermally processed in the atmosphere from 350° C. to 750° C. This can suppress peeling of barrier metal film 3, which will be formed in the following step, from the surface of interlayer insulating film 2.

As shown in FIG. 3, the CVD or sputtering method is then performed to form barrier metal film 3 made of titanium nitride over the surface of contact hole 2a and the upper surface of interlayer insulating film 2. Thereafter, steps similar to those in the fourth embodiment already described with reference to FIGS. 4 and 10–14 are performed.

By using the above manufacturing method, the high-temperature sintering brings about recovery of gate insulating film 13 of the transistor from the process damages and others before formation of aluminum interconnections 7 and 9 as well as interlayer insulating film 8 during the manufacturing steps, similarly to the semiconductor device manufacturing methods of the first, second and third embodiments. Accordingly, the above manufacturing method can provide the semiconductor device which can sufficiently recover from the process damages and others while preventing occurrence of a hillock of aluminum interconnections 7 and 9 and a crack in interlayer insulating film 8.

Similarly to the semiconductor device manufacturing method of the third embodiment, interlayer insulating film 2 is thermally processed at the temperature from 350° C. to 750° C. so that the moisture is removed from interlayer insulating film 2. Therefore, it is possible to prevent peeling of barrier metal film 3, which will be formed on the surface of interlayer insulating film 2, from the surface of interlayer insulating film 2. Accordingly, the semiconductor device having improved reliability can be manufactured.

Similarly to the semiconductor device manufacturing method of the fourth embodiment, barrier metal film 6 is not formed on the upper surface of interlayer insulating film 2, i.e., the portion on which peeling is likely to occur. Therefore, disadvantages due to peeling of barrier metal film 6 do not occur. As a result, the semiconductor device having improved reliability can be manufactured.

In the foregoing first to fifth embodiments, aluminum interconnection 7 is formed as a second conductive interconnection. Instead of aluminum interconnection 7, a Cu, AlCu or AlSiCu interconnection may be formed as the second conductive interconnection.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:

forming a field-effect transistor on a semiconductor substrate; and forming a first conductive interconnection causing a crystal defect if thermally processed at a temperature higher than 450° C. after formation of said transistor, wherein said method includes the step of effecting high-temperature sintering on a gate insulating film of said transistor within a hydrogen atmosphere at a temperature from 450° C. to 600° C. only after said step of forming said transistor and before said step of forming said first conductive interconnection.

2. The method of manufacturing the semiconductor device according to claim 1, further comprising the step of:

forming a interlayer insulating film covering said first conductive interconnection.

3. The method of manufacturing the semiconductor device according to claim 1, further comprising the step of:

forming a second conductive interconnection on said semiconductor substrate before said step of effecting the high-temperature sintering on said gate insulating film, a value of a contact resistance between said second conductive interconnection and an impurity diffusion layer rising when said second conductive interconnection is thermally processed at a temperature exceeding 750° C.

4. The method of manufacturing the semiconductor device according to claim 3, further comprising the steps of:

forming a first interlayer insulating film covering said second conductive interconnection after formation of said second conductive interconnection and before formation of said first conductive interconnection;

forming a contact hole reaching said second conductive interconnection in said first interlayer insulating film; and forming a barrier metal film extending at least along the surface of said contact hole, said first conductive interconnection filling a concavity formed by said barrier metal film and extending on said first interlayer insulating film.

5. The method of manufacturing the semiconductor device according to claim 4, further comprising the step of:

cooling said second conductive interconnection and said barrier metal film in a non-oxidizing atmosphere to 200° C. or lower after said step of effecting the high-temperature sintering on said gate insulating film and before said step of forming said first conductive interconnection.

6. The method of manufacturing the semiconductor device according to claim 4, further comprising the step of:

thermally processing said first interlayer insulating film at a temperature from 350° C. to 750° C. after said step of forming said first interlayer insulating film and before said step of forming said barrier metal film.

7. The method of manufacturing the semiconductor device according to claim 4, wherein said barrier metal film is formed only on the surface of said contact hole in said step of forming said barrier metal film.

* * * * *